United States Patent
Philip et al.

(10) Patent No.: US 11,527,434 B2
(45) Date of Patent: Dec. 13, 2022

(54) LINE CUT PATTERNING USING SACRIFICIAL MATERIAL

(71) Applicant: INTERNATIONAL BUSINESS MACHINES CORPORATION, Armonk, NY (US)

(72) Inventors: Timothy Mathew Philip, Albany, NY (US); Daniel James Dechene, Watervliet, NY (US); Somnath Ghosh, Clifton Park, NY (US); Robert Robison, Rexford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 258 days.

(21) Appl. No.: 16/796,079

(22) Filed: Feb. 20, 2020

(65) Prior Publication Data

US 2021/0265201 A1    Aug. 26, 2021

(51) Int. Cl.
*H01L 21/768*     (2006.01)
*H01L 21/311*     (2006.01)
*H01L 21/033*     (2006.01)
*H01L 21/3213*    (2006.01)

(52) U.S. Cl.
CPC .... *H01L 21/76816* (2013.01); *H01L 21/0332* (2013.01); *H01L 21/0337* (2013.01); *H01L 21/31144* (2013.01); *H01L 21/32139* (2013.01); *H01L 21/76892* (2013.01)

(58) Field of Classification Search
None
See application file for complete search history.

(56) References Cited

U.S. PATENT DOCUMENTS

| | | | |
|---|---|---|---|
| 9,263,325 B1 | 2/2016 | Wei et al. |
| 9,607,886 B1 | 3/2017 | Burns et al. |
| 9,679,809 B1 | 6/2017 | Kye et al. |
| 9,704,859 B1 | 7/2017 | Cheng et al. |
| 9,773,676 B2 | 9/2017 | Chang et al. |
| 9,818,641 B1 | 11/2017 | Bouche et al. |
| 9,991,156 B2 | 6/2018 | Burns et al. |
| 10,242,907 B2 | 3/2019 | Ryckaert et al. |

(Continued)

OTHER PUBLICATIONS

"Pinch Off Plasma CVD Deposition Process and Material Technology for Nano-Device Air Gap/Spacer Formation" by Nguyen et al. (Year: 2018).*

(Continued)

*Primary Examiner* — Evren Seven
(74) *Attorney, Agent, or Firm* — Tutunjian & Bitetto, P.C.; Randy Emilio Tejeda

(57) ABSTRACT

A method for fabricating a semiconductor device includes forming a first line pattern within sacrificial mandrel material disposed on at least one hard mask layer disposed on a substrate. The first line pattern has a pitch defined by a target line width and a minimum width of space between lines. The method further includes forming, within the first line pattern, a first spacer having a width corresponding to the minimum width of space between lines to minimize pinch points and a first gap having the target line width, and forming a first plug within the first gap corresponding to a first location above the at least one hard mask layer to block pattern transfer into the at least one hard mask layer.

20 Claims, 5 Drawing Sheets

(56) References Cited

U.S. PATENT DOCUMENTS

| | | | |
|---|---|---|---|
| 10,256,110 B2 | 4/2019 | Mohanty | |
| 2019/0157082 A1 | 5/2019 | Fan et al. | |
| 2019/0318927 A1* | 10/2019 | Sun | H01L 21/76816 |
| 2019/0378718 A1* | 12/2019 | Chen | G03F 7/091 |
| 2020/0350202 A1* | 11/2020 | Yang | H01L 21/31144 |
| 2021/0143013 A1* | 5/2021 | Liu | H01L 21/0337 |
| 2021/0242020 A1* | 8/2021 | O'Meara | H01L 21/0337 |

OTHER PUBLICATIONS

Raley et al., "Self-Aligned Blocking Integration Demonstration for Critical sub 40nm pitch Mx Level Patterning", Advanced Etch Technology for Nanopatterning VI. International Society for Optics and Photonics. Apr. 7, 2017. vol. 10149, p. 101490O-1-101490O-11.).

* cited by examiner

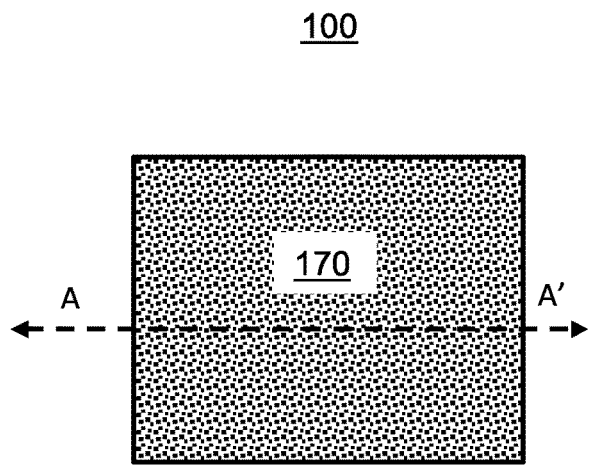
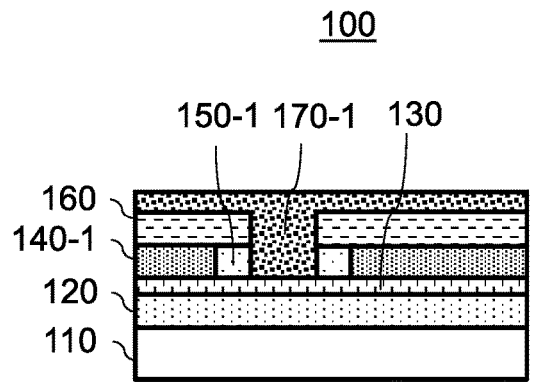
FIG. 5  FIG. 6
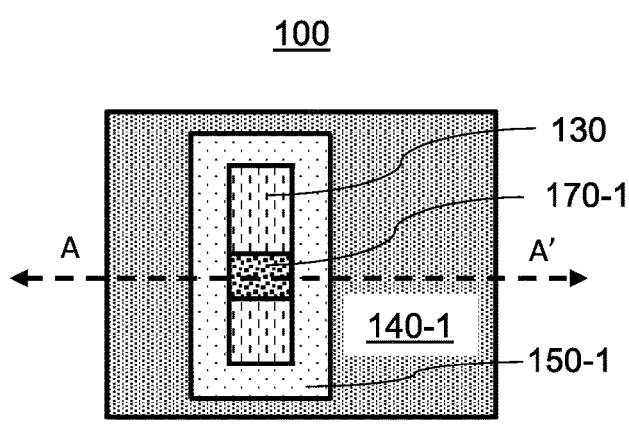
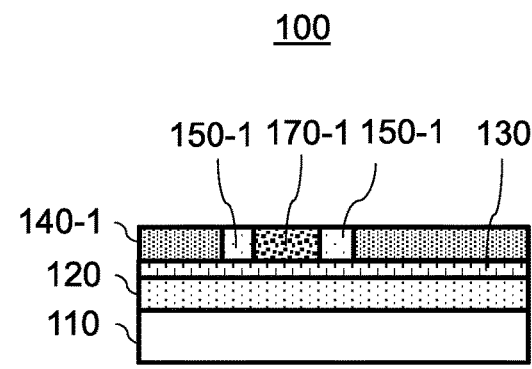
FIG. 7  FIG. 8

LINE CUT PATTERNING USING SACRIFICIAL MATERIAL

BACKGROUND

The present invention generally relates to semiconductor devices, and more particularly to line cut patterning using sacrificial material.

As substrate processing geometries continue to decrease, the challenges of forming structures using photolithography increase. For example, challenges can arise for trench patterning (e.g., back-end-of-line (BEOL) trench patterning) in which sub-30 nm pitch targets can exist.

SUMMARY

In accordance with an embodiment of the present invention, a method for fabricating a semiconductor device is provided. The method includes forming a first line pattern within sacrificial mandrel material disposed on at least one hard mask layer disposed on a substrate. The first line pattern has a pitch defined by a target line width and a minimum width of space between lines. The method further includes forming, within the first line pattern, a first spacer having a width corresponding to the minimum width of space between lines to minimize pinch points and a first gap having the target line width, and forming a first plug within the first gap corresponding to a first location above the at least one hard mask layer to block pattern transfer into the at least one hard mask layer.

In accordance with another embodiment of the present invention, a method for fabricating a semiconductor device is provided. The method includes forming a first line pattern within sacrificial mandrel material disposed on at least one hard mask layer disposed on a substrate. The first line pattern has a pitch defined by a target line width and a minimum width of space between lines. The method further includes forming, within the first line pattern, a first spacer having a width corresponding to the minimum width of space between lines to minimize pinch points and a first gap having the target line width, and forming a first plug as a negative tone plug within the first gap corresponding to a first location above the at least one hard mask layer to block pattern transfer into the at least one hard mask layer. The method further includes forming a second plug corresponding to a second location above the at least one hard mask layer.

In accordance with yet another embodiment of the present invention, a method for fabricating a semiconductor device is provided. The method includes forming a first line pattern within sacrificial mandrel material disposed on a plurality of hard mask layers disposed on a substrate. The first line pattern has a pitch defined by a target line width and a minimum width of space between lines and the plurality of hard mask layers include a first hard mask layer and a second hard mask layer disposed on the first hard mask layer. The method further includes forming, within the first line pattern, a first spacer having a width corresponding to the minimum width of space between lines to minimize pinch points and a first gap having the target line width, and forming a first plug as a negative tone plug including first sacrificial material within the first gap corresponding to a first location above the at least one hard mask layer to block pattern transfer into the at least one hard mask layer. The method further includes forming second sacrificial mandrel material above the first plug, the first spacer and the first sacrificial mandrel material, forming a second line pattern having the pitch within the second sacrificial mandrel material, forming, within the second line pattern, a second spacer having a width corresponding to the minimum width of space between lines to minimize pinch points and a second gap having the target line width, etching back the second spacer to form a second gap having the target line width, forming a line cut at a second location above the at least one hard mask layer, and forming a second plug including second sacrificial material within the line cut.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 5 is a top-down view of a cut process during the fabrication of the semiconductor device, in accordance with an embodiment of the present invention;

FIG. 6 is a cross-sectional view through the device shown in FIG. 5, in accordance with an embodiment of the present invention, in accordance with an embodiment of the present invention;

FIG. 7 is a top-down view of sacrificial cut material etch back and resist strip during the fabrication of the semiconductor device, in accordance with an embodiment of the present invention;

FIG. 8 is a cross-sectional view through the device shown in FIG. 7, in accordance with an embodiment of the present invention, in accordance with an embodiment of the present invention;

DETAILED DESCRIPTION

Figure 1:
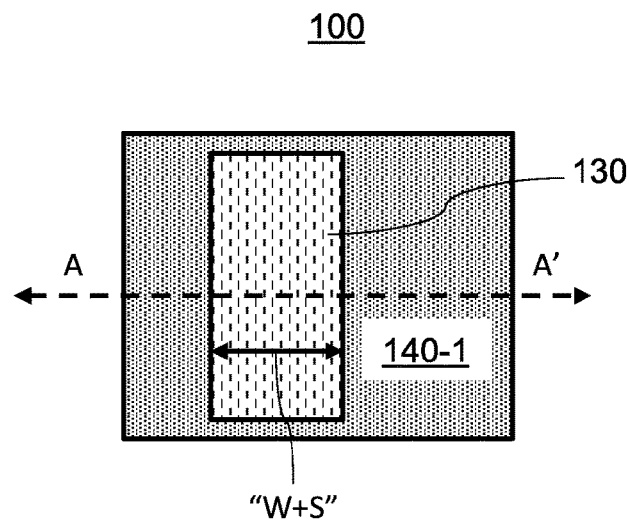
FIG. 1 is a top-down view of the line patterning in mandrel material during the fabrication of a semiconductor device, in accordance with an embodiment of the present invention.

The embodiments described herein provide for line cut patterning. More specifically, the line cut patterning can be performed after line patterning using sacrificial material to pattern interconnects separated by a gap. The line cut patterning can be performed after mandrel patterning, and the cuts can be filled with a sacrificial material to block pattern transfer into the hard mask material. For example, lines can be patterned using spacer-assisted lithography. A plug can be used in the dielectric, as opposed to the hard mask, before the lines are patterned. In one embodiment, the plug can include a negative tone plug. The process described herein can be repeated in accordance with a variety of multi-patterning schemes.

Cut width can be as large or small as needed depending on via enclosure rules needed for the device. Additionally, performing trench patterning with a pillar process can result in a "flop-over" situation where a pillar having a high aspect ratio is unstable and leans or "flops-over" sideways. The embodiments described herein can obviate the need for a "pillar process" that can result in "flop-over," thereby reducing or eliminating the risk of flop-over due to pillar cut processes. Moreover, the embodiments described herein can reduce or eliminate pinch points caused by spacer pinch-off that can result in device reliability issues. Accordingly, the embodiments described herein can improve trench patterning processing and device reliability.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 2:
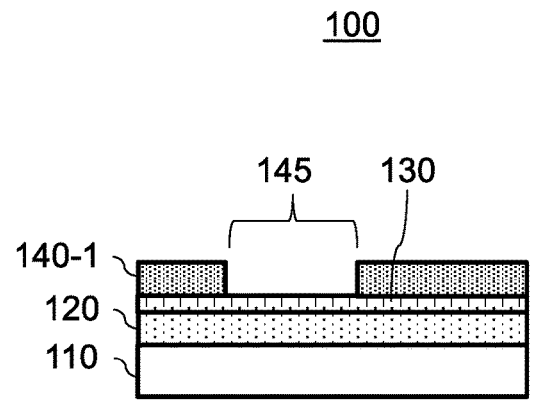
FIG. 2 is a cross-sectional view through the device shown in FIG. 1, in accordance with an embodiment of the present invention.

Referring now to the drawings in which like numerals represent the same or similar elements and initially to FIGS. 1 and 2, a top-down view and a cross-sectional view of a semiconductor device 100 through line A-A' are respectively provided. The features depicted in the drawings may not be drawn to scale, including features depicted in the top-down views and the corresponding features depicted in the cross-sectional views.

As shown, the device 100 includes a substrate 110. In one embodiment, the substrate 110 can be a dielectric or insulating substrate including a dielectric material. For example, the substrate 110 can include, e.g., a silicon oxide material (e.g., silicon dioxide ($SiO_2$)). However, such an example should not be considered limiting.

In another embodiment, the substrate 110 can be a bulk-semiconductor substrate. In one example, the bulk-semiconductor substrate can include a silicon (Si)-containing material. Illustrative examples of Si-containing materials suitable for the bulk-semiconductor substrate include, but are not limited to, Si, SiGe, SiGeC, SiC, polysilicon, epitaxial silicon, amorphous Si, and multi-layers thereof. Although silicon is the predominantly used semiconductor material in wafer fabrication, alternative semiconductor materials can be employed, such as, but not limited to, germanium, gallium arsenide, gallium nitride, silicon germanium, cadmium telluride and zinc sellenide.

In another embodiment, the substrate 110 can be a semiconductor-on-insulator (SOI) substrate including a base substrate layer, a semiconductor layer and a dielectric material (e.g., buried oxide) formed therebetween.

The device 100 can further include hard mask material including one or more hard mask layers. In this illustrative example, the hard mask material can include a hard mask layer 120 and a hard mask layer 130.

The hard mask layers 120 and 130 can include any suitable materials in accordance with the embodiments described herein. Examples of suitable materials for the hard mask layers 120 and 130 include, but are not limited to, silicon nitride (e.g., SiN), titanium nitride (TiN), silicon oxide (e.g., $SiO_2$), etc. For example, in one embodiment, the hard mask layer 120 can include, e.g., titanium nitride (TiN) and the hard mask layer 130 can include, e.g., silicon nitride (e.g., SiN).

As further shown, the device 100 further includes sacrificial mandrel material 140-1. The sacrificial mandrel material 140-1 can include any suitable material in accordance with the embodiments described herein. Examples of suitable materials that can be used to form the sacrificial mandrel material 140-1 can include, but are not limited to, amorphous silicon (a-Si), amorphous germanium (a-Ge), silicon nitride (e.g., SiN), etc.

As further shown, a line pattern 145 corresponding to a conductive line is formed into the sacrificial mandrel material 140-1 using a line patterning process. Any suitable process can be used to form the line pattern 145 in accordance with the embodiments described herein. In one embodiment, the line patterning process can include spacer-assisted lithography.

In an exemplary embodiment, the conductive line corresponding to the line pattern 145 is a metal line that will be formed to include a metal material. However, the conductive line corresponding to the line pattern 145 can include any suitable conductive material in accordance with the embodiments described herein.

As indicated in FIG. 1, the line pattern 145 can be formed having a conductive line pitch, "W+S". Here, "W" corresponds to a target line width of the conductive line, and "S" corresponds to a minimum width of the space between conductive lines. As will be discussed in further detail below with reference to FIGS. 3 and 4, the value of "S" corresponds to a thickness of a spacer that will be formed within the line pattern 145. "W" and "S" can have any suitable values in accordance with the embodiments described herein.

For example, "W" can have a value ranging from, e.g., about 5 nm to about 50 nm. "S" can assume any value as long as "W+S" is less than a target conductive line pitch. For example, the target conductive line pitch can be a conductive line pitch selected within a range of, e.g., about 10 nm to about 50 nm.

Figure 3:
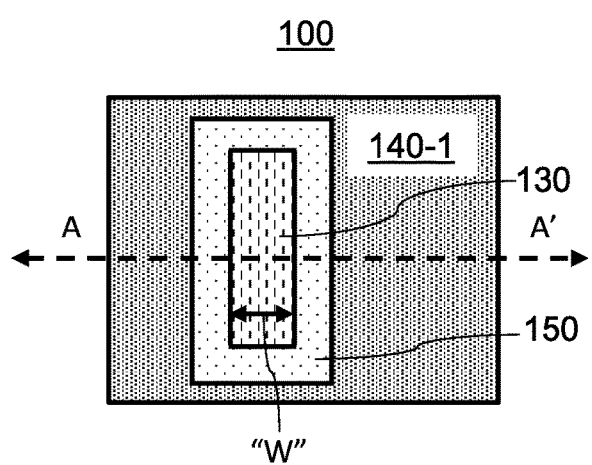
FIG. 3 is a top-down view of the formation of a spacer during the fabrication of the device, in accordance with an embodiment of the present invention.
Figure 4:
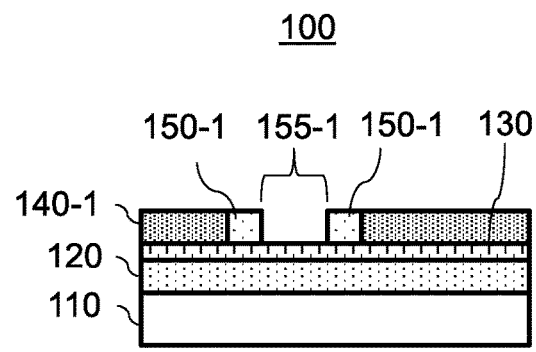
FIG. 4 is a cross-sectional view through the device shown in FIG. 3, in accordance with an embodiment of the present invention.

With reference to FIGS. 3 and 4, a top-down view and a cross-sectional view of the device 100 through line A-A' are provided showing the formation of a spacer 150-1 within the line pattern 145. The spacer 150-1 is formed in a manner that minimizes (e.g., eliminate) pinch points that can be caused by spacer pinch off.

The spacer 150-1 can be formed having a thickness "S", which can result in the formation of a gap 155-1 having the target line width "W". For example, the spacer 150-1 can be formed by depositing spacer material, and etching back the spacer material to form the gap 155-1. However, such an embodiment should not be considered limiting.

The spacer material of the spacer 150-1 can include any suitable material in accordance with the embodiments described herein. Examples of suitable spacer materials that can be used to form the spacer 150-1 include, but are not limited to, $SiO_2$, SiN, $TiO_2$, etc.

With reference to FIGS. 5 and 6, a top-down view and a cross-sectional view of the device 100 through line A-A' are provided showing a line cut patterning process. More specifically, lithography material including a resist 160 (e.g., photoresist) can be formed on the sacrificial mandrel material 104, patterning can be formed to form a line cut filled, and sacrificial cut material 170-1 can be formed in the line cut. The line cut patterning process can be performed immediately before mandrel patterning.

The sacrificial cut material 170-1 fills the gap 155-1 to block pattern transfer into the hard mask material. The sacrificial cut material 170-1 can include any suitable material in accordance with the embodiments described herein. Examples of suitable materials for the sacrificial cut material 170-1 include, but are not limited to, spin-on glass (SOG) materials (e.g., $SiO_2$). In one embodiment, the sacrificial cut material 170-1 can include the same material as the spacer 150-1 for etch selectivity purposes and simplicity.

With reference to FIGS. 7 and 8, a top-down view and a cross-sectional view of the device 100 through line A-A' are provided showing the etching back of the sacrificial cut material 170-1 and the removal (e.g., stripping) of lithography material including the resist 160. Any suitable processes can be used to etch back the sacrificial cut material 170-1 and remove the lithography material including the resist 160 in accordance with the embodiments described herein.

This processing shown in FIGS. 7 and 8 results in the formation of a plug including the sacrificial cut material 170-1 within the line pattern above the hard mask layer 130. In one embodiment, the plug can be a negative tone plug.

Figure 9:
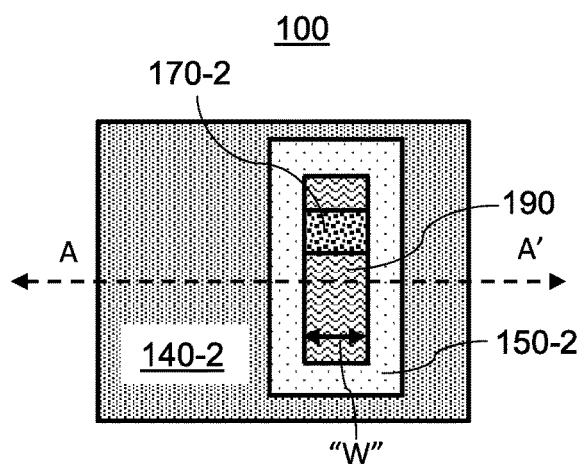
FIG. 9 is a top-down view of repeating of the line patterning, the formation of a spacer, and the cut process during the fabrication of the device, in accordance with an embodiment of the present invention.
Figure 10:
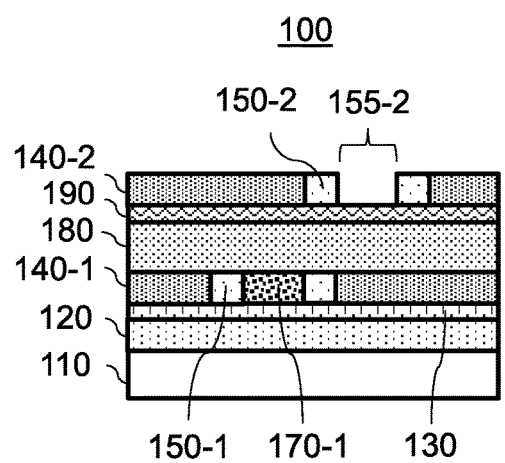
FIG. 10 is a cross-sectional view through the device shown in FIG. 9, in accordance with an embodiment of the present invention.

With reference to FIGS. 9 and 10, a top-down view and a cross-sectional view of the device 100 through line A-A' are provided showing additional processing to repeat the line patterning, spacer formation and cut processes in accordance with a multi-patterning scheme. In this illustrative example, a double patterning scheme is shown. However, the patterning process in accordance with the embodiments described herein can be repeated for any suitable number of cycles for a corresponding multi-patterning scheme.

More specifically, as shown in FIGS. 9 and 10, lithography material including lithography layers 180 and 190 can formed. For example, the lithography layer 180 can include an organic planarization layer (OPL) and the lithography layer 190 can include an antireflective coating (ARC) layer (e.g., a SiARC layer). The lithography layers 180 and 190 can include any suitable materials in accordance with the embodiments described herein.

After the lithography layers 180 and 190 have been formed, the line patterning, spacer formation and cut processes can be repeated to form sacrificial mandrel material 140-2, spacer 150-2, gap 155-2 and sacrificial cut material 170-2, similar to the processes described above with reference to FIGS. 1-8. For example, the spacer 150-2 can be formed by depositing spacer material, and etching back the spacer material to form the gap 155-2. However, such an embodiment should not be considered limiting.

As further shown in FIGS. 9 and 10, the left end of the spacer 150-2 can align with the right end of the spacer 150-1, and the spacer 150-2 can be formed such that the gap 155-2 has a width of W. The sacrificial mandrel material 140-2, the spacer 150-2 and the sacrificial cut material 170-2 can include any suitable materials in accordance with the embodiments described herein.

Figure 11:
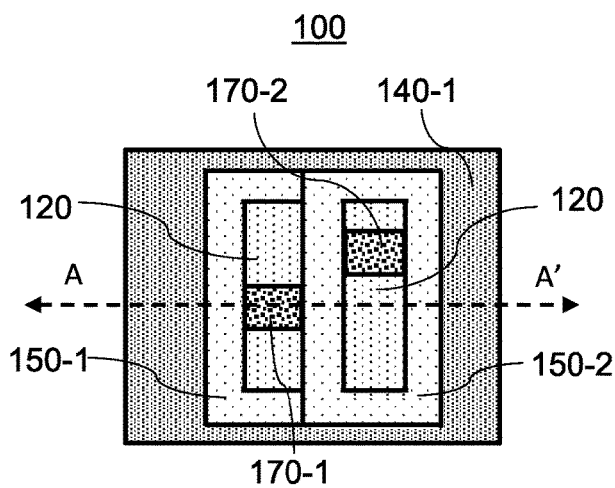
FIG. 11 is a top-down view of a selective etch performed during the fabrication of the semiconductor device, in accordance with an embodiment of the present invention.
Figure 12:
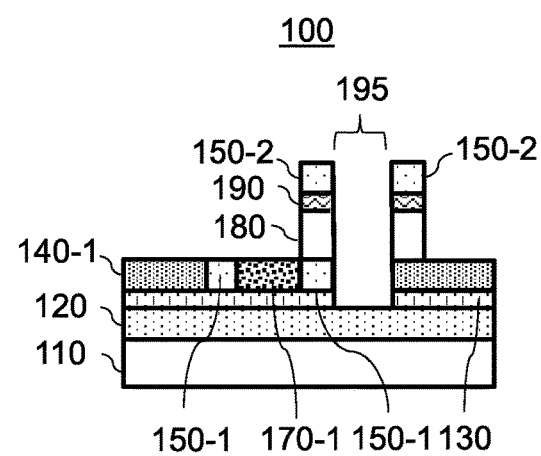
FIG. 12 is a cross-sectional view through the device shown in FIG. 11, in accordance with an embodiment of the present invention.

With reference to FIGS. 11 and 12, a top-down view and a cross-sectional view of the device 100 through line A-A' are provided showing a selective etch performed to remove material. As shown, material is removed up to the sacrificial cut material 170-1 and 170-2, and the material within the gap 155-2 is removed down to the hard mask 120 to form a gap 195.

This processing shown in FIGS. 11 and 12 results in the formation of a second plug, including the sacrificial cut material 170-2, within the line pattern above the hard mask layer 130. In one embodiment, the second plug can be a negative tone plug.

Figure 13:
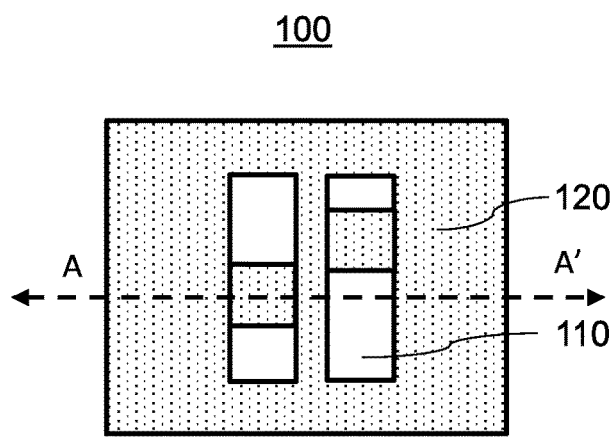
FIG. 13 is a top-down view of pattern transfer into hard mask material without etching the sacrificial cut material and removal of material during the fabrication of the semiconductor device, in accordance with an embodiment of the present invention.
Figure 14:
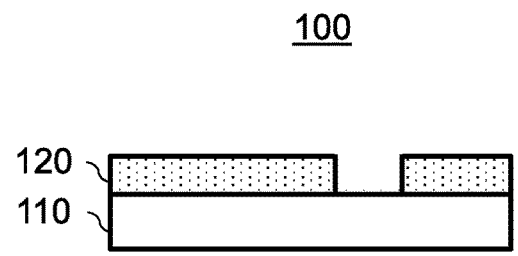
FIG. 14 is a cross-sectional view through the device shown in FIG. 13, in accordance with an embodiment of the present invention.

With reference to FIGS. 13 and 14, the pattern is transferred into the hard mask 120 without etching the sacrificial cut materials 170-1 and 170-2, and material above the hard mask 120 is removed using any suitable process in accordance with the embodiments described herein.

Figure 15:
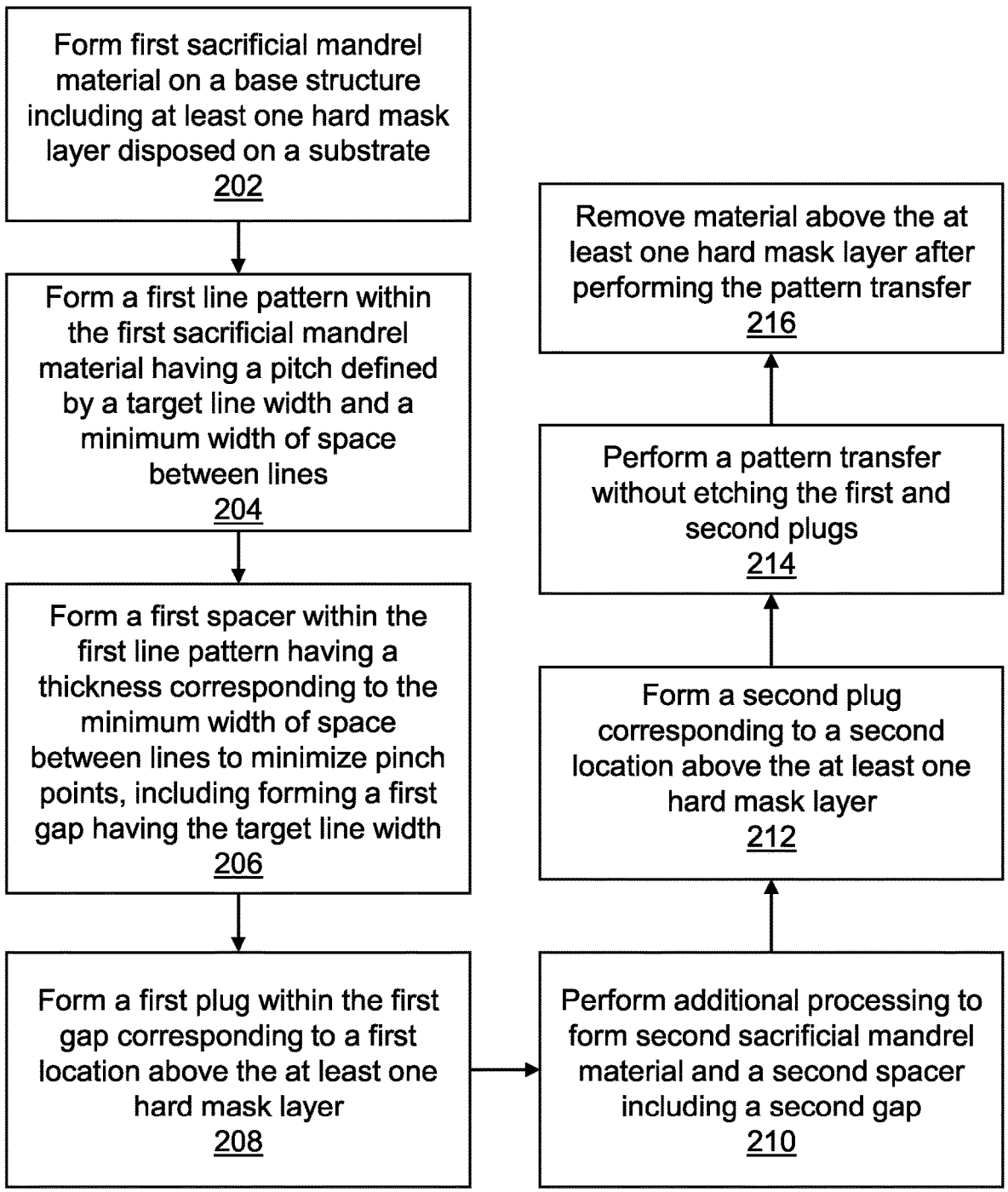
FIG. 15 is a block/flow diagram illustrating a system/method for fabricating a semiconductor device, in accordance with an embodiment of the present invention.

With reference to FIG. 15, a block/flow diagram is shown illustrating a system/method 200 for fabricating a semiconductor device. The procedure described in FIG. 15 can be repeated to accomplish a multi-patterning scheme.

At block 202, first sacrificial mandrel material is formed on a base structure including at least one hard mask layer disposed on a substrate. The first sacrificial mandrel material can include any suitable material in accordance with the embodiments described herein. Examples of suitable materials for the first sacrificial mandrel material include, but are not limited to, amorphous silicon (a-Si), amorphous germanium (a-Ge), silicon nitride (e.g., SiN), etc.

In one embodiment, the at least one hard mask layer can include a first hard mask layer and a second hard mask layer. The first hard mask can be formed on the substrate and the second hard mask layer can be formed on the first hard mask layer. The first and second hard mask layers can include any suitable material in accordance with the embodiments described herein. Examples of suitable materials for the first and second hard mask layers include, but are not limited to, silicon nitride (e.g., SiN), titanium nitride (TiN), silicon oxide (e.g., $SiO_2$), etc. For example, in one embodiment, the first hard mask layer can include, e.g., titanium nitride (TiN) and the second hard mask layer can include, e.g., silicon nitride (e.g., SiN).

At block 204, a first line pattern is formed within the first sacrificial mandrel material. In one embodiment, the first line pattern is formed using spacer-assisted lithography. However, such an embodiment should not be considered limiting. The first line pattern can be formed having a conductive line pitch, "W+S", less than a target conductive line pitch. For example, the target conductive line pitch can be a conductive line pitch selected within a range of, e.g., about 10 nm to about 50 nm.

At block 206, a first spacer is formed within the first line pattern having a thickness corresponding to the minimum width of space between lines to minimize pinch points, including forming a first gap having the target line width. For example, forming the first spacer can include depositing first spacer material, and etching back the first spacer material to form the first gap. However, such an embodiment should not be considered limiting.

The first spacer can include any suitable material in accordance with the embodiments described herein. Examples of suitable materials for the first spacer include, but are not limited to, $SiO_2$, SiN, $TiO_2$, etc.

At block 208, a first plug corresponding to a first location above the at least one hard mask layer is formed within the first gap. The first plug includes first sacrificial cut material to block hard mask pattern transfer into the at least one hard mask layer, and etching back the first sacrificial cut material. In one embodiment, the first plug is a negative tone plug.

Any suitable process can be used to form the first sacrificial cut material within the first gap and etch back the first sacrificial cut material in accordance with the embodiments described herein. For example, forming the first plug can include depositing the first sacrificial cut material within the first gap, and etching back the first sacrificial cut material to about a height of the sacrificial mandrel material.

The first sacrificial cut material can include any suitable material in accordance with the embodiments described herein. Examples of suitable materials for the first sacrificial cut material include, but are not limited to, spin-on glass (SOG) materials (e.g., SiO$_2$). In one embodiment, the first sacrificial cut material can include the same material as the first spacer for etch selectivity purposes and simplicity.

Further details regarding blocks 202-208 are described above with reference to FIGS. 1-8.

In some embodiments, a multi-patterning process can be performed to form one or more additional plugs at one or more respective locations above the at least one hard mask layer disposed on the substrate.

For example, at block 210, additional processing is performed to form second sacrificial mandrel material, and a second spacer including a second gap. The second spacer can have a thickness corresponding to the minimum width of space between lines, and the second gap can have the target line width. The left end of the second spacer can be aligned with the right end of the first spacer. The second sacrificial mandrel material and the second spacer including the second gap, can be formed using a same or similar process as described above with reference to the first sacrificial mandrel material and the first spacer including the first gap.

The second sacrificial mandrel material and the second spacer can include any suitable materials in accordance with the embodiments described herein. In one embodiment, the second sacrificial mandrel material and the second spacer can include the same materials as the first sacrificial mandrel material and the first spacer, respectively. In other embodiments, at least one of the second sacrificial mandrel material and second spacer and second sacrificial cut material can include a different material from the first sacrificial mandrel material and the first spacer, respectively.

At block 212 a second plug corresponding to a second location above the at least one hard mask layer can be formed. Any suitable process can be used to form the second plug in accordance with the embodiments described herein. For example, forming the second plug can include performing a line cut patterning process to form a line cut at the second location, and filling the line cut with second sacrificial cut material.

The second sacrificial cut material can include any suitable material in accordance with the embodiments described herein. In one embodiment, the second sacrificial cut material can include the same materials as the first sacrificial cut material. In another embodiment, the second sacrificial cut material can include a different material from the first sacrificial cut material.

At block 214, a pattern transfer is performed without etching the first and second plugs. Performing the pattern transfer can include removing material up to the first and second plugs, and removing material within the second gap to the at least one hard mask layer to form a third gap. The material can be removed using a suitable selective etch process. The pattern transfer can transfer the pattern into the hard mask material of the at least one hard mask layer. Any suitable process can be used to perform the pattern transfer accordance with the embodiments described herein.

In this embodiment, it is assumed that both the first and second plugs have been formed in a multi-patterning scheme. However, in an embodiment in which only the first plug is formed, then the pattern transfer can be performed without etching the first sacrificial cut material.

At block 216, material above the at least one hard mask layer is removed after performing the pattern transfer. For example, if the at least one hard mask layer includes a first hard mask layer and a second hard mask layer, material above the first hard mask layer can be removed.

Further details regarding blocks 210-216 are described above with reference to FIGS. 9-11.

Having described preferred embodiments of a semiconductor device and a method of fabricating the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device, comprising:
   forming a first line pattern within sacrificial mandrel material disposed on at least one hard mask layer disposed on a substrate, the first line pattern having a pitch defined by a target line width and a minimum width of space between lines;
   forming, within the first line pattern, a first spacer having a width corresponding to the minimum width of space between lines so that a combined dimension of the target line width and the width of the spacer ranges from 10 nm to 50 nm, wherein the forming the first spacer minimizes pinch points and provides a first gap having the target line width;
   forming a first plug within the first gap corresponding to a first location above the at least one hard mask layer to block pattern transfer into the at least one hard mask layer;
   forming a line cut at a second location above the at least one hard mask;
   forming, within the line cut, a second plug corresponding to the second location and including second sacrificial cut material to block pattern transfer into the at least one hard mask layer; and
   removing material up to the first and second plugs to form a third gap.

2. The method of claim 1, further comprising patterning the first sacrificial mandrel material to form the first line pattern.

3. The method of claim 1, wherein the first plug is a negative tone plug.

4. The method of claim 1, wherein the at least one hard mask layer includes a first hard mask layer and a second hard mask layer.

5. The method of claim 4, wherein the first hard mask layer includes titanium nitride and the second hard mask layer includes silicon nitride.

6. The method of claim 1, wherein the first plug includes first sacrificial cut material, and further comprising:
   forming second sacrificial mandrel material above the first plug, the first spacer and the first sacrificial mandrel material;
   forming a second line pattern having the pitch within the second sacrificial mandrel material;
   forming, within the second line pattern, a second spacer having a width corresponding to the minimum width of space between lines to minimize pinch points and a second gap having the target line width; and
   etching back the second spacer to form a second gap having the target line width.

7. The method of claim 6, wherein the removing material up to the first and second plugs to the at least one hard mask layer to form a third gap.

8. The method of claim 7, further comprising performing a pattern transfer without etching the first plug.

9. The method of claim 8, further comprising removing material above the at least one hard mask layer after performing the pattern transfer.

10. A method for fabricating a semiconductor device, comprising:
- forming a first line pattern within sacrificial mandrel material disposed on at least one hard mask layer disposed on a substrate, the first line pattern having a pitch defined by a target line width and a minimum width of space between lines;
- forming, within the first line pattern, a first spacer having a width corresponding to the minimum width of space between lines so that a combined dimension of the target line width and the width of the spacer ranges from 10 nm to 50 nm, wherein the forming the first spacer minimizes pinch points and provides a first gap having the target line width;
- forming a first plug as a negative tone plug within the first gap corresponding to a first location above the at least one hard mask layer to block pattern transfer into the at least one hard mask layer; and
- forming a second plug corresponding to a second location above the at least one hard mask layer.

11. The method of claim 10, further comprising patterning the first sacrificial mandrel material to form the first line pattern.

12. The method of claim 10, wherein the at least one hard mask layer includes a first hard mask layer including titanium nitride and a second hard mask layer including silicon nitride.

13. The method of claim 10, further comprising:
- forming second sacrificial mandrel material above the first plug, the first spacer and the first sacrificial mandrel material;
- forming a second line pattern having the pitch within the second sacrificial mandrel material;
- forming a second spacer within the first line pattern having a width corresponding to the minimum width of space between lines and a first gap having the target line width; and
- etching back the second spacer to form a second gap having the target line width.

14. The method of claim 13, wherein the first plug includes first sacrificial cut material, and wherein forming the second plug further includes forming a line cut at the second location, and filling the line cut with second sacrificial cut material to block pattern transfer into the at least one hard mask layer.

15. The method of claim 14, further comprising:
- removing material up to the first and second plugs and material within the second gap to the at least one hard mask layer to form a third gap; and
- performing a pattern transfer without etching the first and second plugs.

16. The method of claim 15, further comprising removing material above the at least one hard mask layer after performing the pattern transfer.

17. A method for fabricating a semiconductor device, comprising:
- forming a first line pattern within sacrificial mandrel material disposed on a plurality of hard mask layers disposed on a substrate, the first line pattern having a pitch defined by a target line width and a minimum width of space between lines, and the plurality of hard mask layers including a first hard mask layer and a second hard mask layer disposed on the first hard mask layer;
- forming, within the first line pattern, a first spacer having a width corresponding to the minimum width of space between lines so that a combined dimension of the target line width and the width of the spacer ranges from 10 nm to 50 nm, wherein the forming the first spacer minimizes pinch points and provides a first gap having the target line width;
- forming a first plug as a negative tone plug including first sacrificial cut material within the first gap corresponding to a first location above the at least one hard mask layer to block pattern transfer into the at least one hard mask layer;
- forming second sacrificial mandrel material above the first plug, the first spacer and the first sacrificial mandrel material;
- forming a second line pattern having the pitch within the second sacrificial mandrel material;
- forming, within the second line pattern, a second spacer having a width corresponding to the minimum width of space between lines to minimize pinch points and a second gap having the target line width;
- etching back the second spacer to form a second gap having the target line width;
- forming a line cut at a second location above the at least one hard mask layer; and
- forming a second plug including second sacrificial cut material within the line cut.

18. The method of claim 17, further comprising patterning the first sacrificial mandrel material to form the first line pattern.

19. The method of claim 17, wherein the first hard mask layer includes titanium nitride and the second hard mask layer includes silicon nitride.

20. The method of claim 17, further comprising:
- removing material up to the first and second plugs and material within the second gap to the first hard mask layer to form a third gap;
- performing a pattern transfer without etching the first and second plugs; and
- removing material above the first hard mask layer after performing the pattern transfer.

* * * * *